United States Patent [19]
Emoto

[11] Patent Number: 6,118,173
[45] Date of Patent: Sep. 12, 2000

[54] LEAD FRAME AND A SEMICONDUCTOR DEVICE

[75] Inventor: Yoshiaki Emoto, Tateyama, Japan

[73] Assignee: Nippon Steel Semiconductor Corporation, Tateyama, Japan

[21] Appl. No.: 08/969,770

[22] Filed: Nov. 13, 1997

[30] Foreign Application Priority Data

Nov. 14, 1996 [JP] Japan ..................................... 8-316901

[51] Int. Cl.[7] ................................................. H01L 23/495
[52] U.S. Cl. ........................................... 257/666; 257/676
[58] Field of Search ..................................... 257/666, 676

[56] References Cited

U.S. PATENT DOCUMENTS

| | | | |
|---|---|---|---|
| 5,386,141 | 1/1995 | Liang et al. ............................ | 257/676 |
| 5,530,281 | 6/1996 | Groover Et Sl . | |
| 5,592,019 | 1/1997 | Ueda et al. . | |
| 5,629,559 | 5/1997 | Muyahara . | |
| 5,637,915 | 6/1997 | Sato et al. ............................... | 257/676 |
| 5,648,681 | 7/1997 | Takashima et al. . | |

Primary Examiner—Sheila V. Clark
Attorney, Agent, or Firm—Pollock, Vande Sande & Amernick

[57] ABSTRACT

A semiconductor device of this invention includes a semiconductor chip on which a device is formed, inner leads reaching the periphery of the semiconductor chip, and bonding wires for electrically connecting the semiconductor chip and the inner leads. The semiconductor chip is fixed on a die pad portion, and a chip fixing inner lead is integrated with the die pad portion. To simplify the bonding wire connection process and improve the reliability, the chip fixing inner lead has a step portion so that the die pad portion is formed at a lower position than the inner leads. The step portion is formed so as to be offset from a line of the end portions of the inner leads in the opposite direction of the semiconductor chip, so an arbitrary bonding wire can be kept apart from the step portion. According to this invention, a semiconductor device which can properly prevent contact between the step portion and the bonding wire to improve the reliability, and a lead frame applicable to this semiconductor device can be provided.

7 Claims, 7 Drawing Sheets

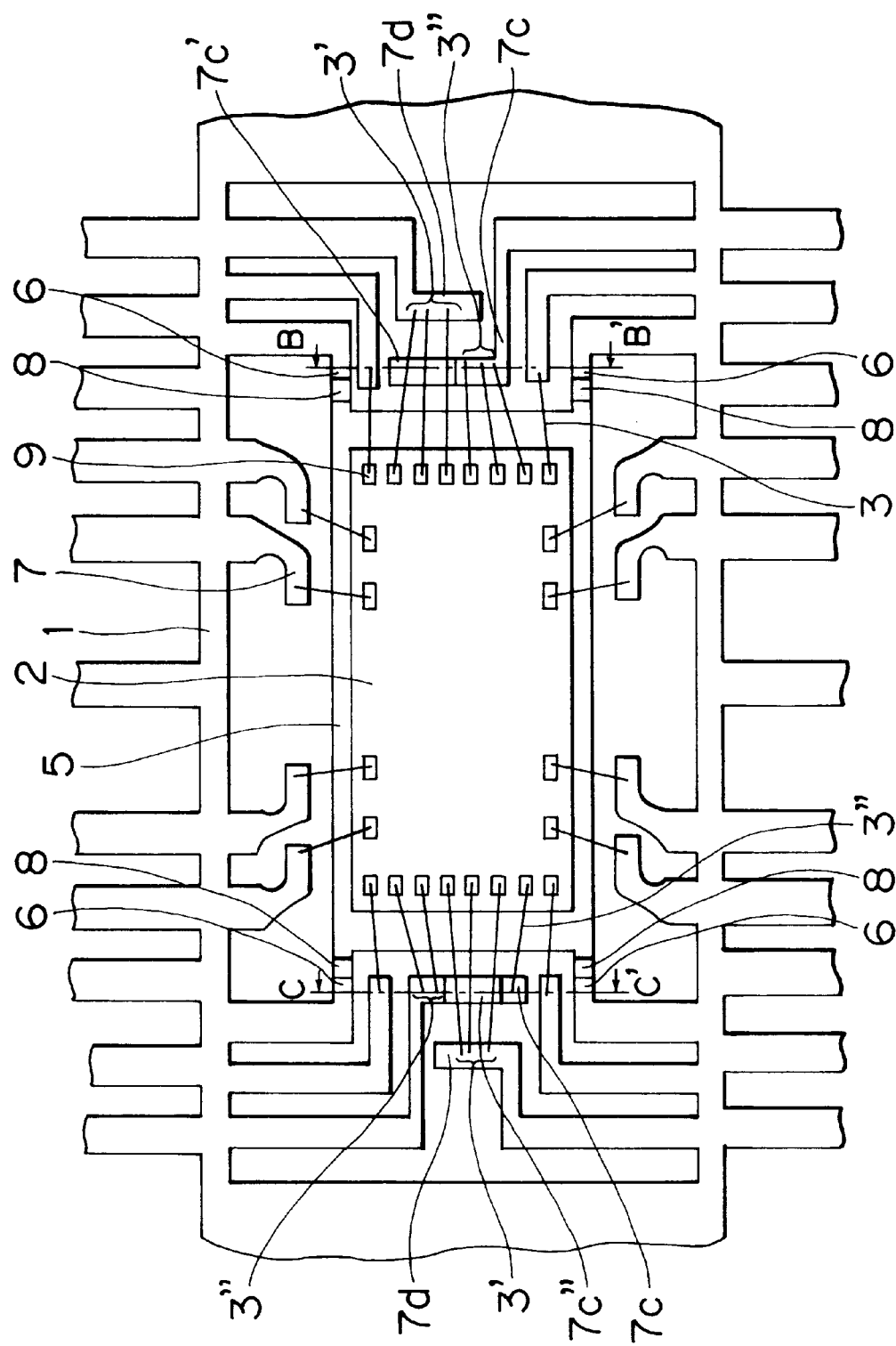

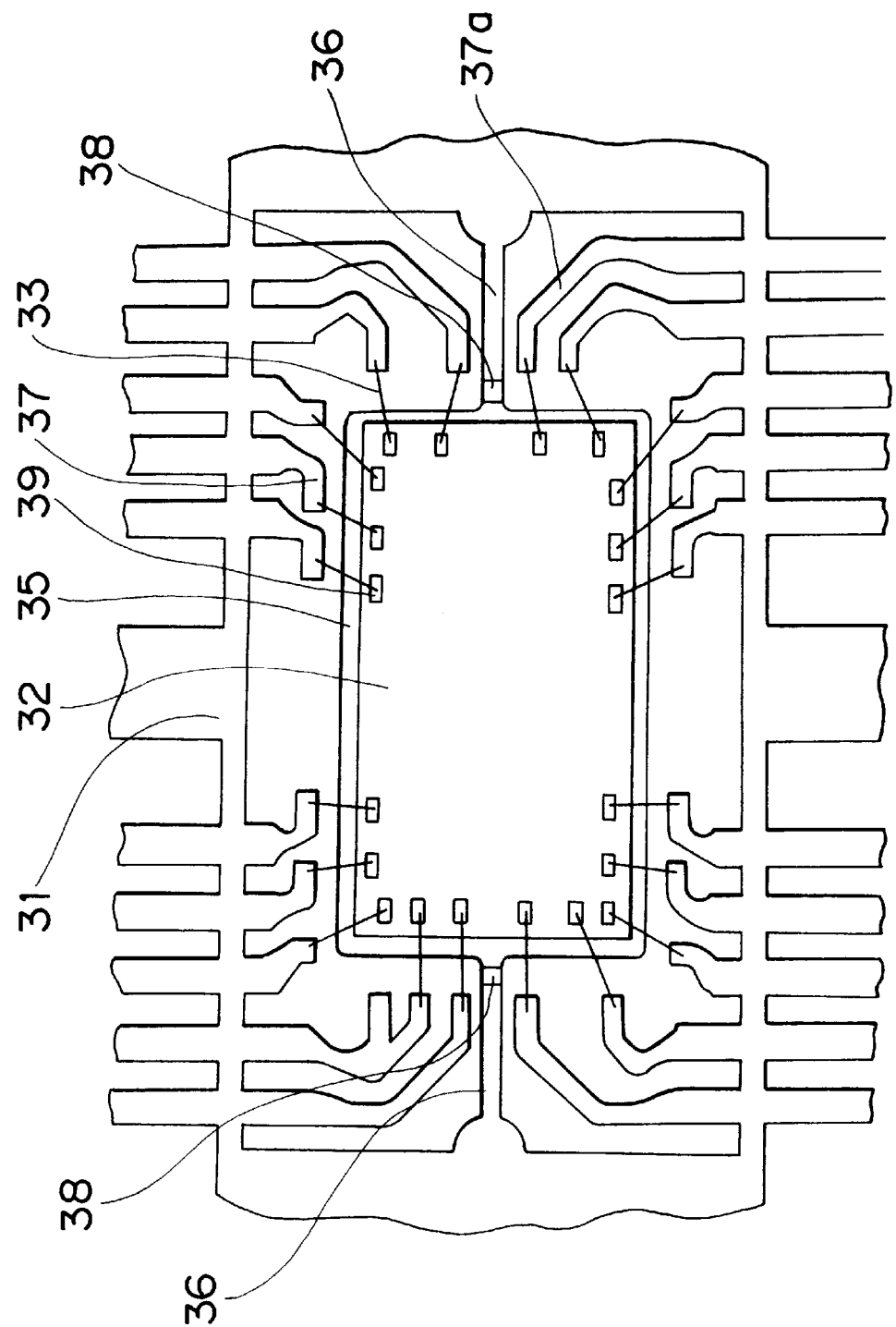

LEAD FRAME AND A SEMICONDUCTOR DEVICE

BACKGROUND OF THE INVENTION

1. Field of the Invention

The present invention relates to a semiconductor device in which inner leads and a chip are electrically connected and, more particularly, to a semiconductor device, having improved inner leads, which is suitable for a large-capacity memory.

The present invention also relates to a lead frame suitable for a semiconductor device having a large-capacity memory.

2. Description of the Related Art

As in the case with recent micropatterning of semiconductor devices, chip size is also being reduced. Along with the reduction in chip size, the pitch of bonding pads on a chip, which are to be electrically connected to a lead frame by bonding wires, also becomes narrow.

As shown in FIG. 3A, in a conventional semiconductor device, to form a usable package as a final product from a chip having a device thereon, a chip 32 is bonded on a lead frame 31, and bonding pads 39 on the chip 32 are electrically connected to inner leads 37 of the lead frame 31 by bonding wires 33.

After all the bonding pads 39 are connected to the inner leads 37, the resultant structure is covered with a resin. The lead frame 31 is cut into a predetermined shape, and terminals to be connected to an external device are formed, thereby forming the package as the final product.

In FIG. 3A, if the lead frame 31 is completely flat, the bonding pad 39 on the chip 32 mounted on the lead frame 31 is at a higher position than the inner lead 37 by the thickness of the chip 32. The bonding pad 39 must be connected to the inner lead 37 by the bonding wire 33 over a step, resulting in a complex process. In addition, the bonding wire 33 may be cut off by the edge of the chip 32.

To solve these problems, in the conventional semiconductor device as shown in FIG. 3A, a die pad portion 35 is formed in the lead frame 31 to form a step corresponding to the thickness of the chip 32 between the die pad portion 35 and the inner lead 37. More specifically, the die pad portion 35 is formed to be integrated with the lead frame 31, and a step portion 38 is formed in a fixing inner lead 36 connected to the die pad portion 35. With this arrangement, the die pad portion 35 can be formed at a lower position than the inner lead 37. Since the upper surface of the chip 32 can be made almost flush with the inner lead 37, the above-described problem can be avoided.

However, in a micropatterned semiconductor device, a plurality of power supply pads may be formed among the bonding pads 39 on the chip 32, as shown in FIG. 3B. In some cases, power supply leads 37a of the inner leads 37 and the power supply pads cannot be formed in one-to-one correspondence under the required spatial limitations. In such a case, a plurality of, e.g., four bonding pads are connected to one power supply lead 37a (FIG. 3B).

In general, the shape and size of the lead frame do not change even when the chip size is reduced, because the pin arrangement or the like is based on a standard or defacto standard, and interchangeability between pins must be maintained. When the chip size is reduced, the chip is arranged at the center of the package, i.e., on a portion of the die pad portion 35 closer to the fixing inner lead 36, as shown in FIG. 3C. The interval of bonding pads denoted by "a" in FIG. 3B is designed on the basis of a minimum exposure size and often cannot be decreased anymore. In this case, the bonding pads are formed close together using a portion denoted by "b" in FIG. 3B where no bonding pads have been formed.

When all the bonding pads are formed at the interval "a" designed on the basis of the minimum exposure size to reduce the chip size, as shown in FIG. 3C, some bonding pads which have been on the lower side of the fixing inner lead 36, in the drawing, in a conventional semiconductor device having relatively large chip size may move to the upper side of the fixing inner lead 36.

In addition, when conditions for formation of a semiconductor device in the chip 32 are restricted and capacity is increased, a plurality of power supply pads or ground pads on the chip 32 cannot be formed close together in a region. For this reason, these pads may be formed at random intervals on the chip 32.

In this case, since the power supply leads and the power supply pads can hardly be formed in one-to-one correspondence, as described above, the power supply leads must be extended to cover the region where the power supply pads or ground pads are formed. However, when the power supply leads or ground leads are formed over a wide area, they may interfere with bonding wires to be connected to other inner leads, or the space for other inner leads cannot be ensured.

SUMMARY OF THE INVENTION

It is an object of the present invention to provide a semiconductor device in which inner leads and a chip are electrically connected by bonding wires and which prevents interference between the bonding wires in a manner the inner leads, even when the space used is reduced along with the reduction in chip size, thereby improving the reliability.

It is another object of the present invention to provide a lead frame suitable for use in a semiconductor device in which the space is reduced along with the reduction in chip size.

According to an aspect of the present invention, there is provided a lead frame comprising a die pad portion, a plurality of inner leads reaching a periphery of the die pad portion, and a fixing inner lead connected to the die pad portion, wherein the fixing inner lead has a step portion so that the die pad portion has a surface lower than the inner leads, and the step portion is offset from an end portion of the inner lead in the opposite direction of the die pad portion.

Preferably, the step portion is constituted by a tilted surface, and a bent portion forming the tilted surface is offset from the end portion in the opposite direction of the die pad portion.

Preferably, the step portion is offset from an end portion of the inner lead adjacent to the fixing inner lead.

According to another aspect of the present invention, there is provided a semiconductor device comprising a semiconductor chip having a plurality of bonding pads on an upper surface, a chip fixing inner lead fixed to the semiconductor chip, a plurality of inner leads reaching a periphery of the semiconductor chip, and bonding wires for connecting the bonding pads and the inner leads. The chip fixing inner lead has a step portion, and the step portion is offset from an end portion of the inner lead in the opposite direction of the semiconductor chip.

Preferably, the step portion is constituted by a tilted surface, and a bent portion forming the tilted surface is offset from the end portion of the inner lead in the opposite direction of the semiconductor chip.

Preferably, the step portion is offset from an end portion of the inner lead adjacent to the chip fixing inner lead.

Preferably, the chip fixing inner lead has a die pad portion at a portion where the semiconductor chip is fixed.

Preferably, the semiconductor chip is fixed on a die pad portion integrated with the chip fixing inner lead, the chip fixing inner lead outside the step portion is formed to be flush with the inner leads. The die pad portion is formed to have a surface lower than the inner leads in the presence of the step portion.

According to still another aspect of the present invention, there is provided a lead frame comprising a die pad portion, a plurality of inner leads reaching a periphery of the die pad portion, and a fixing inner lead connected to the die pad portion. At least two of the inner leads are formed in parallel in the opposite direction of the die pad portion, and at least one portion of the inner lead close to the die pad portion is offset downward from the inner lead arranged farther from the die pad portion.

Preferably, at least one of the inner leads formed in parallel is formed along and in parallel with the die pad portion.

Preferably, the inner lead close to the die pad portion is connected to the die pad portion.

Preferably, the inner lead far from the die pad portion is formed to be flush with the lead frame.

Preferably, the fixing inner lead has a step portion so that the die pad portion has a surface lower than the lead frame.

According to still another aspect of the present invention, there is provided a semiconductor device comprising a semiconductor chip having a plurality of bonding pads on an upper surface, a plurality of inner leads reaching a periphery of the semiconductor chip, and bonding wires for connecting the bonding pads and the inner leads. At least two of the inner leads are formed in parallel in the opposite direction of the semiconductor chip, and at least one portion of the inner lead close to the semiconductor chip is offset downward from the inner lead far from the semiconductor chip.

Preferably, at least one of the inner leads formed in parallel is formed along and in parallel with the semiconductor chip.

Preferably, the inner lead close to the semiconductor chip is a chip fixing inner lead fixed to the semiconductor chip.

Preferably, the device further comprises a chip fixing inner lead for fixing the semiconductor chip, and the semiconductor chip is fixed on a die pad portion integrated with the chip fixing inner lead.

Preferably, the chip fixing inner lead has a step portion, the chip fixing inner lead outside the step portion is formed to be flush with the inner lead far from the semiconductor chip, and the die pad portion is formed to have a surface lower than the inner lead far from the semiconductor chip in the presence of the step portion.

Preferably, in the inner lead close to the semiconductor chip, the bonding wire is connected to a portion other than the offset portion.

Preferably, at least one of the inner leads formed in parallel is one of a power supply lead and a ground lead.

According to still another aspect of the present invention, there is provided a semiconductor device comprising a semiconductor chip having a plurality of bonding pads on an upper surface, a plurality of inner leads reaching a periphery of the semiconductor chip, and bonding wires for connecting the bonding pads and the inner leads, wherein at least one portion of a specific inner lead whose two-dimensional position overlaps that of the bonding wire connected to another specific inner lead is offset downward from the another specific inner lead.

Preferably, the specific inner lead is a chip fixing inner lead fixed to the semiconductor chip.

Preferably, the device further comprises a chip fixing inner lead for fixing the semiconductor chip, and the semiconductor chip is fixed on a die pad portion integrated with the chip fixing inner lead.

Preferably, the bonding wire to be connected to the specific inner lead is connected to a portion other than the offset portion.

Preferably, the chip fixing inner lead has a step portion, the chip fixing inner lead outside the step portion is formed to be flush with the another specific inner lead, and the die pad portion is formed to have a surface lower than the another specific inner lead in the presence of the step portion.

Preferably, the specific inner lead is one of a power supply lead and a ground lead.

In the present invention, a fixing inner lead or an inner lead in a region where the bonding wires are arranged are offset by a predetermined amount to be prevented from interfering with the bonding wires.

According to the present invention, a problem such as a short circuit of the bonding wires can be avoided. Therefore, a highly reliable semiconductor device and a lead frame for this semiconductor device can be provided.

BRIEF DESCRIPTION OF THE DRAWINGS

FIG. 2A is a schematic plan view showing the entire arrangement of a semiconductor device according to the second embodiment;

FIG. 3A is a schematic plan view showing the entire arrangement of a conventional semiconductor device;

DETAILED DESCRIPTION OF THE PREFERRED EMBODIMENTS

First Embodiment

The first embodiment of the present invention will be described below with reference to FIGS. 1A to 1C.

Figure 1A:
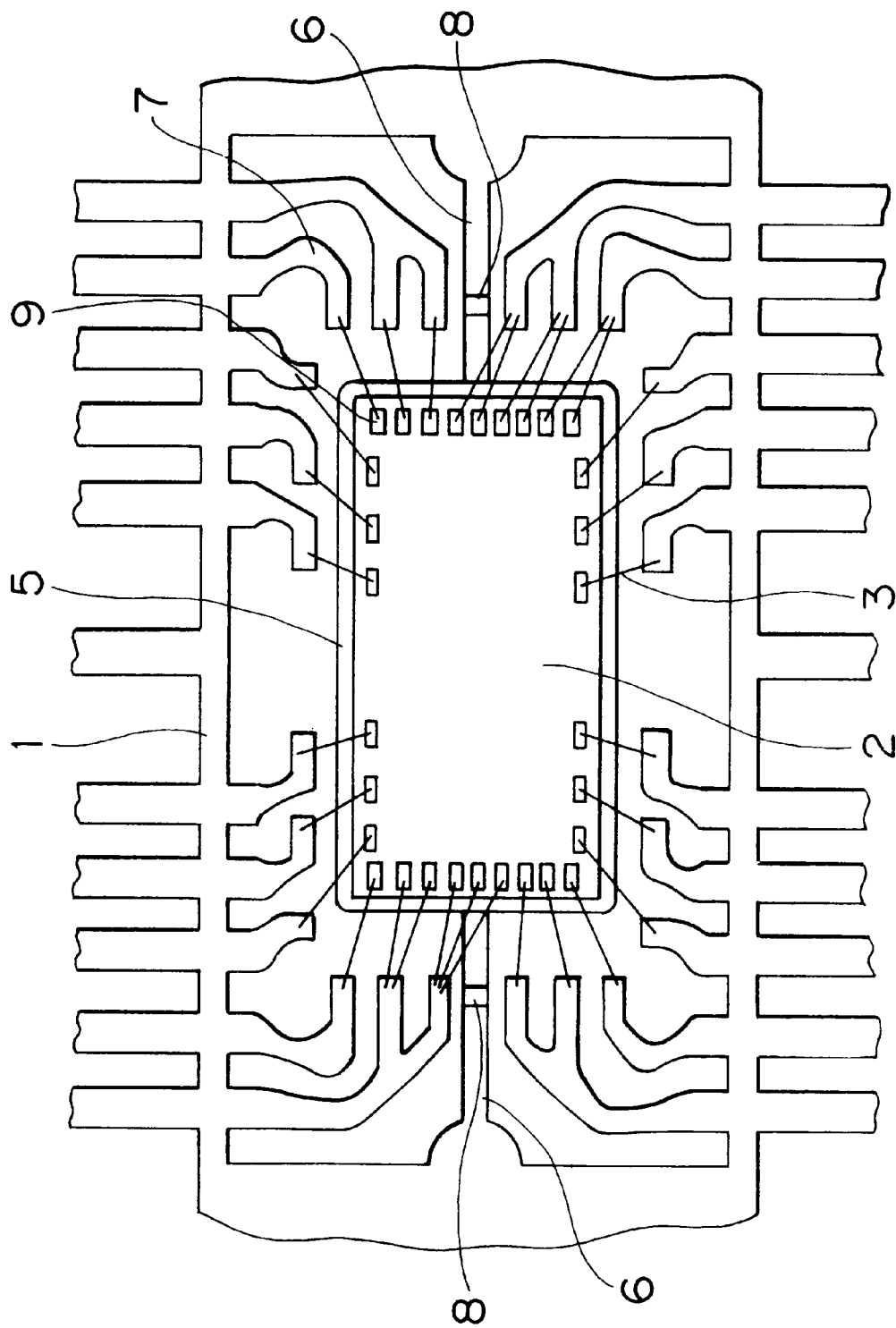
FIG. 1A is a schematic plan view showing the entire arrangement of a semiconductor device according to the first embodiment.

FIG. 1A is a plan view showing the entire arrangement of a semiconductor device according to the first embodiment of the present invention. This semiconductor device comprises a lead frame 1 consisting of a thin metal plate, and a chip 2 fixed on the lead frame 1. The lead frame 1 and the chip 2 are electrically connected by a plurality of bonding wires 3.

The lead frame 1 consisting of a plate member is formed into a frame shape and integrated with a die pad portion 5 which is formed inside the lead frame 1. The lead frame 1 and the die pad portion 5 are connected through fixing inner leads 6 each formed at one portion on a corresponding one of the left and right sides, as shown in FIG. 1A.

A plurality of inner leads 7 extend from the lead frame 1 toward the die pad portion 5. All the inner leads 7 are formed to be flush with the lead frame 1 having a frame shape.

Each fixing inner lead 6 has, near the die pad portion 5, a step portion 8 having a tilted surface formed by pressing. In FIG. 1A, the step portion 8 is formed such that the die pad portion 5 has a surface lower than the lead frame 1 almost by the thickness of the chip 2. Therefore, the upper surface of the chip 2 mounted on the die pad portion 5 is almost flush with the lead frame 1 and the inner leads 7.

A plurality of bonding pads 9 to be connected to the bonding wires 3 are formed on the chip 2. The bonding pads 9 are formed along the edge of the chip 2 so as to positionally correspond to the inner leads 7. The bonding pads 9 and the inner leads 7 which positionally correspond to each other are electrically connected by the bonding wires 3.

Figure 1B:
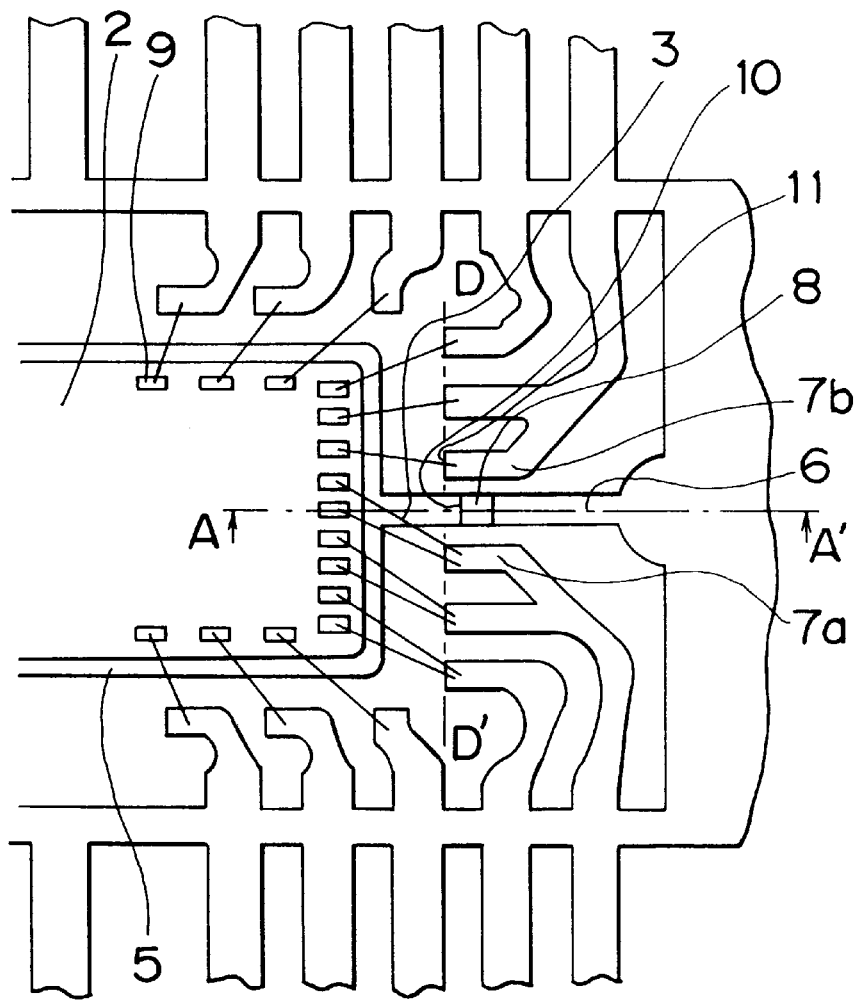
FIG. 1B is a schematic plan view showing the main part of the semiconductor device according to the first embodiment.

FIG. 1B is an enlarged view showing details of the two-dimensional positional relationship between the step portion 8 and the bonding wires 3. FIG. 1C is a sectional view taken along a line A–A' in FIG. 1B.

In FIG. 1B, of the inner leads 7, an inner lead 7a adjacent to the fixing inner lead 6 is a power supply (Vcc) terminal. The other inner leads 7b are input/output signal terminals. In the micropatterned semiconductor device, as shown in this embodiment, the inner lead 7a serving as a power supply terminal is connected to a plurality of bonding pads 9.

Figure 1C:
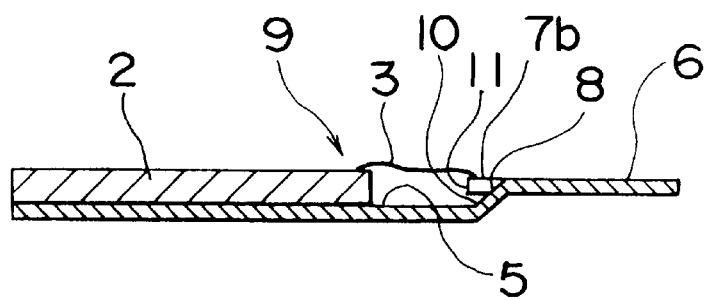
FIG. 1C is a schematic sectional view showing the main part of the semiconductor device according to the first embodiment.

As described above, since the upper surface of the chip 2 is made almost flush with the inner leads 7 by the step portion 8, the bonding wire 3 connects the bonding pad 9 and the inner lead 7b almost horizontally, as shown in FIG. 1C.

As shown in FIG. 1C, a bent portion 10 as the boundary between the die pad portion 5 and the step portion 8 is formed apart from a line of end portions 11 of the inner leads 7 in the opposite direction of the die pad portion 5.

Therefore, as shown in the plan view of FIG. 1B, when the bonding pads 9 are connected to the inner lead 7a by the bonding wires 3, a sufficient distance can be ensured between the bonding wires 3 and the step portion 8.

More specifically, the bent portion 10 is formed so as to be offset in the opposite direction of the chip 2 beyond a line D–D' in FIG. 1B. With this arrangement, even when an arbitrary bonding pad 9 is connected to an arbitrary inner lead 7, the bonding wire 3 does not come into contact with the fixing inner lead 6. In addition, with this arrangement, even when the position of the inner lead 7a serving as a power supply terminal changes, or the interval of the bonding pads 9 decreases, interference between the bonding wires 3 and the fixing inner lead 6 can be prevented.

Therefore, a short circuit between the bonding wires 3 and the fixing inner lead 6 can be prevented, and the reliability can be improved.

After all the bonding pads 9 are connected to the inner leads 7 by the bonding wires 3, the chip 2, the inner leads 7, and the bonding wires 3 are covered with a resin to form a package for encapsulating the die pad portion 5, the chip 2, the inner leads 7, and the bonding wires 3.

Thereafter, the lead frame 1 projecting outward is cut into a predetermined shape and bent, thus completing a package having terminals.

According to the first embodiment having the above arrangement, the bent portion 10 as the boundary between the die pad portion 5 and the step portion 8 is formed apart from a line of the end portions 11 of the inner leads 7 in the opposite direction of the die pad portion 5. For this reason, even when an arbitrary bonding pad 9 is connected to an arbitrary inner lead 7, the bonding wire 3 does not come into contact with the fixing inner lead 6.

Therefore, even when the interval of the bonding pads 9 decreases with the reduction in size of the chip 2, a short circuit between the bonding wires 3 and the step portion 8 can be prevented, so a highly reliable semiconductor device can be manufactured.

Second Embodiment

The second embodiment of the present invention will be described below with reference to FIGS. 2A to 2C. The same reference numerals as in the first embodiment denote the same elements in the second embodiment.

FIG. 2A is a plan view showing the entire arrangement of a semiconductor device according to the second embodiment of the present invention. Recently, along with an increase in the capacity of a chip, demands for arranging power supply pads on the chip and ground pads at arbitrary positions has arisen. In the second embodiment, a semiconductor device which meets this demand will be described. As in the first embodiment, this semiconductor device comprises a lead frame 1 consisting of a thin metal plate, and a chip 2 fixed on the lead frame 1. The lead frame 1 and the chip 2 are electrically connected by a plurality of bonding wires 3.

The lead frame 1, consisting of a plate member, is formed into a frame shape and integrated with a die pad portion 5 which is formed inside the lead frame 1. The lead frame 1 and the die pad portion 5 are connected through fixing inner leads 6 each formed at two portions on a corresponding one of the left and right sides, as shown in FIG. 2A. A plurality of inner leads 7 extend from the lead frame 1 toward the die pad portion 5.

Each fixing inner lead 6 has, near the die pad portion 5, a step portion 8 having a tilted surface formed by pressing. As in the first embodiment, the step portion 8 is formed such that the die pad portion 5 has a surface lower than the lead frame 1 almost by the thickness of the chip 2.

Therefore, the upper surface of the chip 2 mounted on the die pad portion 5 is almost flush with the lead frame 1 and the inner leads 7.

A plurality of bonding pads 9 to be connected to the bonding wires 3 are formed on the chip 2, as in the first embodiment. The bonding pads 9 are formed along the edge of the chip 2 so as to positionally correspond to the inner leads 7. The bonding pads 9 and the inner leads 7 which positionally correspond to each other are electrically connected by the bonding wires 3.

Of the inner leads 7, a power supply lead 7c is arranged along the short side of the chip 2, and a ground lead 7d is arranged outside the power supply lead 7c. As described above, since the power supply pads and ground pads are arranged at arbitrary positions on the chip 2, these pads must be connected to the corresponding power supply leads 7c and the corresponding ground leads 7d without interfering with the bonding wires.

Figure 2B:
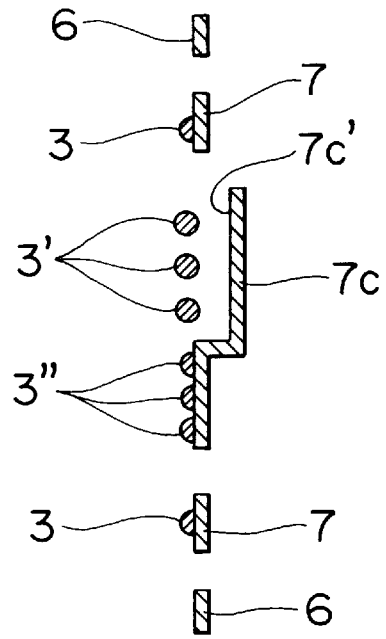
FIG. 2B is a schematic sectional view showing the main part of the semiconductor device according to the second embodiment.
Figure 2C:
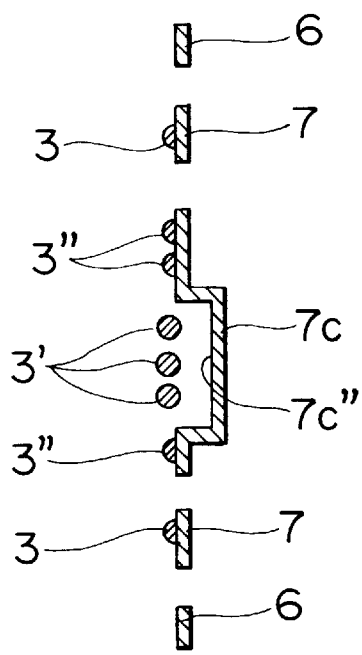
FIG. 2C is a schematic sectional view showing the main part of the semiconductor device according to the second embodiment.
Figure 3B:
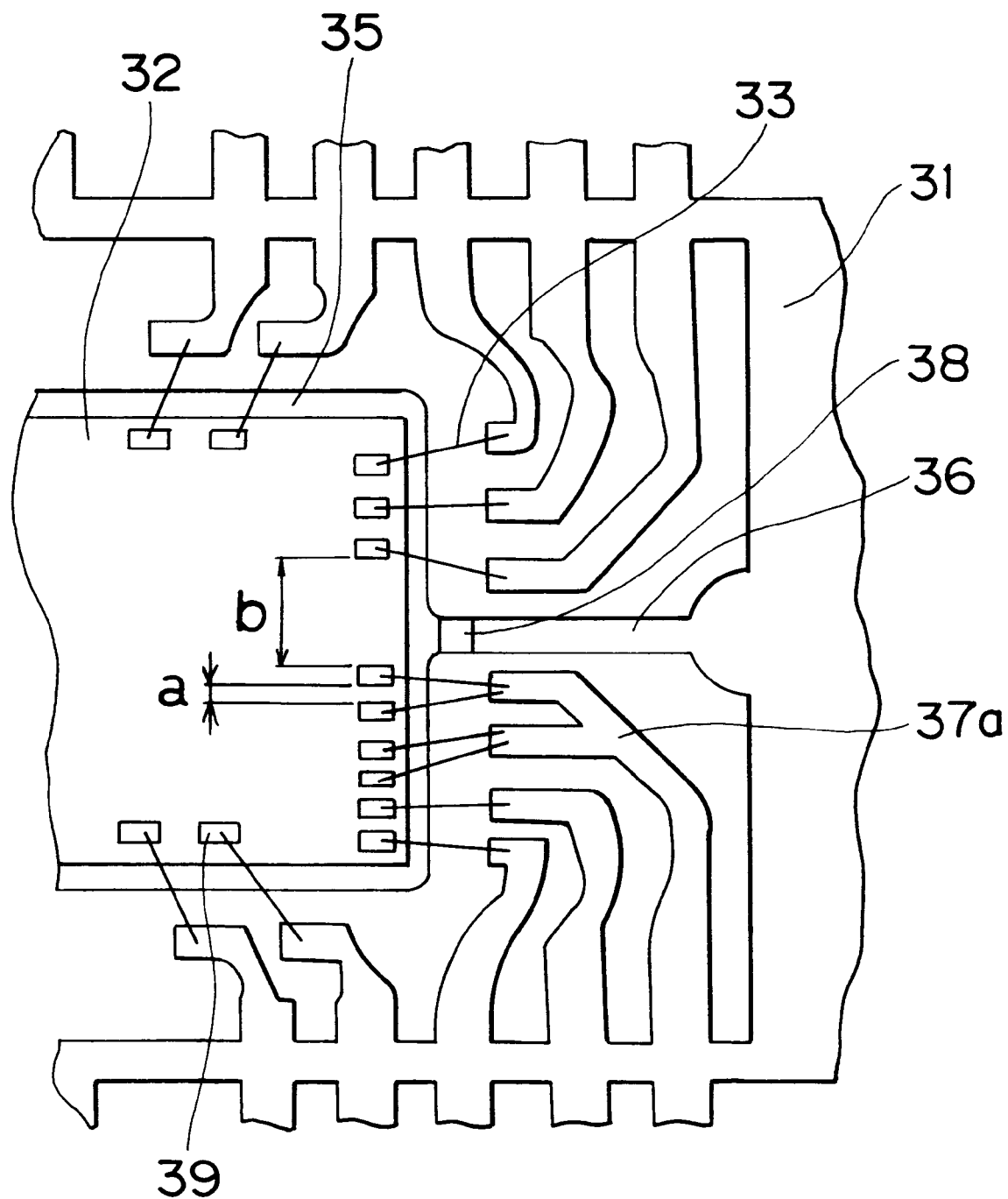
FIG. 3B is a schematic plan view showing the main part of the conventional semiconductor device.
Figure 3C:
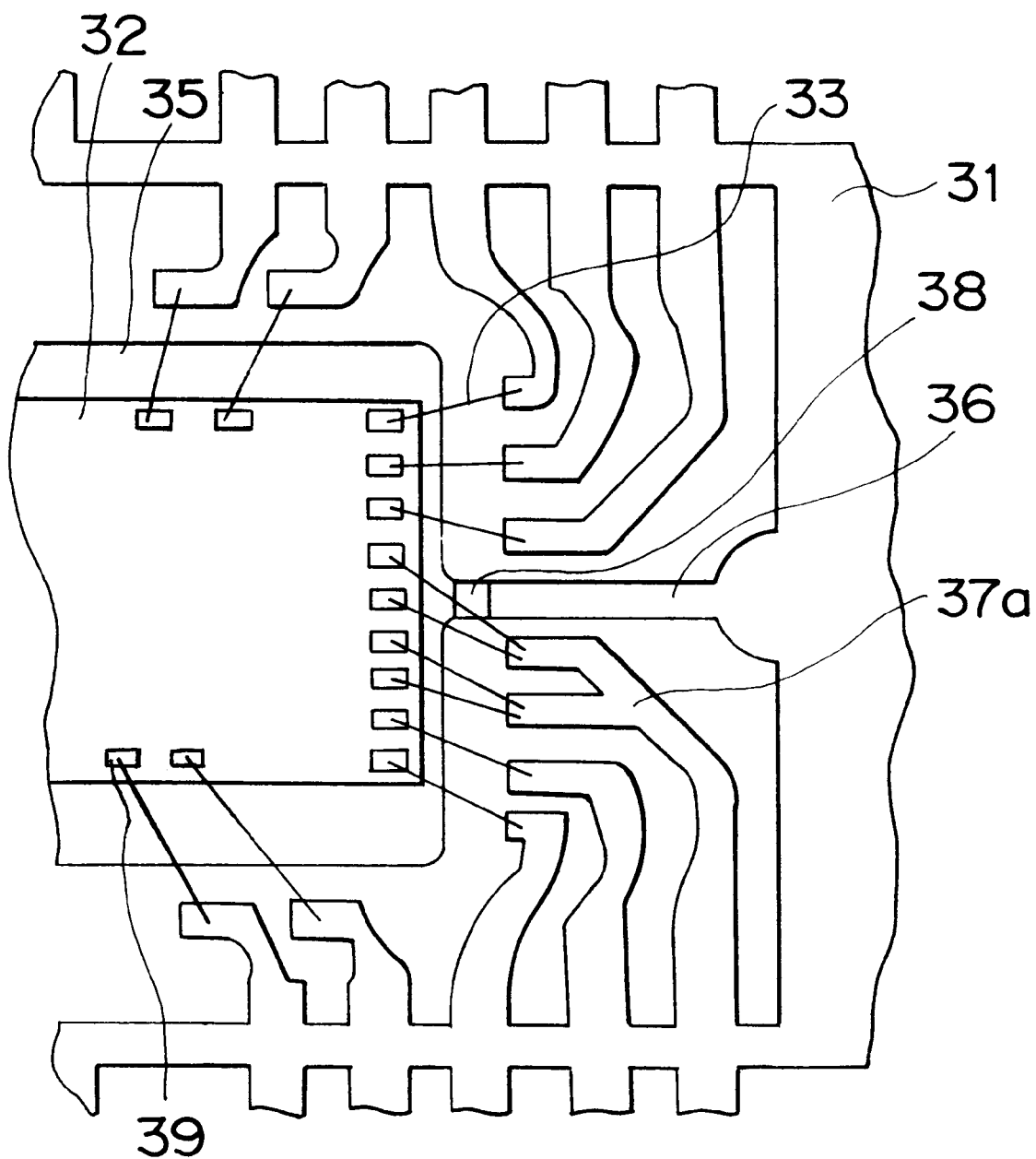
FIG. 3C is a schematic plan view showing the main part of the conventional semiconductor device.

FIGS. 2B and 2C are sectional views showing the height of the power supply lead 7c. FIG. 2B shows a section taken along a ling B–B' in FIG. 2A, and FIG. 2C shows a section taken along a line C–C' in FIG. 2A.

As shown in FIGS. 2B and 2C, a recessed portion 7c' is formed at the distal end portion of the power supply lead 7c by bending. With this arrangement, bonding wires 3' to be connected to the ground lead 7d can be connected to the ground lead 7d arranged outside the power supply lead 7c without contact with the power supply lead 7c. Bonding wires 3" to be connected to the power supply lead 7c are connected to the power supply lead 7c at a portion other than the recessed portion 7c'. Therefore the bonding wires 3 can be almost horizontally extracted from the bonding pads 9 on the chip 2 and connected to the inner leads 7.

FIG. 2C shows an example in which the bonding wires 3" to be connected to the power supply lead 7c are set on both sides of the bonding wires 3' to be connected to the ground lead 7d. In this case, the power supply lead 7c has a recessed portion 7c" at a portion where the bonding wires 3' pass. With this arrangement, a short circuit between the bonding wires 3' and the power supply lead 7c can be prevented. As in the above-described example, the bonding wires 3" to be connected to the power supply lead 7c are connected to the power supply lead 7c at a portion other than the recessed portion 7c". Therefore the bonding wires 3 can be almost horizontally extracted from the bonding pads 9 and connected to the inner leads 7.

After all the bonding pads 9 are connected to the inner leads 7 by the bonding wires 3, the chip 2, the inner leads 7, and the bonding wires 3 are covered with a resin to form a package for encapsulating the die pad portion 5, the chip 2, the inner leads 7, and the bonding wires 3, as in the first embodiment.

Thereafter, the lead frame 1 projecting outward is cut into a predetermined shape and bent, thus completing a package having terminals.

According to the second embodiment having the above described arrangement, when the power supply lead 7c is arranged around the chip 2, and the ground lead 7d is arranged outside the power supply lead 7c, the recessed portions 7c' and 7c" are formed in the power supply lead 7c at a portion where the bonding wires 3' interfere with the power supply lead 7c. With this arrangement, reliable wiring can be made without a short circuit between the power supply lead 7c and the bonding wires 3'.

Even when power supply pads or ground pads are arranged at arbitrary positions on the chip 2, wiring can be effectively made without causing interference between the bonding wires and inner leads, so the reliability can be improved.

In the second embodiment, the power supply lead and the ground lead are adjacent to each other. However, the present invention is not limited to this. The present invention can also be applied to a case wherein the power supply lead and a signal lead, the ground lead and a signal lead, or different signal leads are adjacent to each other.

What is claimed is:

1. A semiconductor device comprising:

a semiconductor chip having a plurality of bonding pads on an upper surface;

a plurality of inner leads; and bonding wires connecting said bonding pads and said inner leads, wherein at least one inner lead of said plurality of inner leads has a lower portion than is lower than a remainder of said plurality of inner leads, one of said bonding wires connected to said at least one inner lead is not connected to said lower portion.

2. A semiconductor device comprising:

a semiconductor chip having a plurality of bonding pads on an upper surface;

a plurality of inner leads; and bonding wires connecting said bonding pads and said inner leads, wherein at least one inner lead of said plurality of inner leads has a lower portion than is lower than a remainder of said plurality of inner leads, said lower portion overlaps at least one of said bonding wires connected to said remainder of said plurality of inner leads.

3. The device according to claim 2, further comprising a chip fixing inner lead for fixing said semiconductor chip, and wherein said semiconductor chip is fixed on a die pad portion integrated with said chip fixing inner lead.

4. The device according to claim 2, wherein said at least one inner lead is a chip fixing inner lead fixed to said semiconductor chip.

5. The device according to claim 2, wherein another bonding wire is connected to said at least one inner lead at a portion other than said lower portion.

6. The device according to claim 3, wherein said chip fixing inner lead has a step portion, an outside portion of said step portion of said chip fixing inner lead is formed to be flush with said other inner lead, and said die pad portion is formed to have a surface lower than said other inner lead.

7. The device according to claim 2, wherein said at least one inner lead is one of a power supply lead and a ground lead.

* * * * *